US009344006B2

(12) United States Patent
Kimmer

(10) Patent No.: US 9,344,006 B2
(45) Date of Patent: May 17, 2016

(54) DRIVING CIRCUIT FOR A TRANSISTOR

(75) Inventor: Thomas Kimmer, Poertschach (AT)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 940 days.

(21) Appl. No.: 13/481,982

(22) Filed: May 29, 2012

(65) Prior Publication Data
US 2013/0322125 A1 Dec. 5, 2013

(51) Int. Cl.
*H02M 3/335* (2006.01)
*H02M 7/537* (2006.01)
*H03K 17/16* (2006.01)
*H02M 1/00* (2006.01)

(52) U.S. Cl.
CPC ............ *H02M 7/537* (2013.01); *H03K 17/163* (2013.01); *H03K 17/168* (2013.01); *H02M 2001/0054* (2013.01); *H03K 2217/0036* (2013.01); *H03K 2217/0072* (2013.01); *Y02B 70/1441* (2013.01); *Y02B 70/1491* (2013.01)

(58) Field of Classification Search
CPC ............ H02M 3/335; H02M 3/33569; Y02B 70/1433; H03K 19/00361
USPC ................... 363/16, 21.04; 327/108
See application file for complete search history.

(56) References Cited

U.S. PATENT DOCUMENTS

| 3,100,848 | A | * | 8/1963 | Skerritt ................. 327/215 |
| 4,337,494 | A | * | 6/1982 | Huykman ................ 361/86 |
| 5,200,878 | A | | 4/1993 | Sasagawa et al. |
| 6,891,707 | B2 | | 5/2005 | Hiyama et al. |
| 7,649,401 | B2 | * | 1/2010 | Scollo ............... H03K 17/567 327/108 |
| 2007/0216375 | A1 | | 9/2007 | Achart et al. |
| 2010/0006563 | A1 | | 1/2010 | Schilling et al. |

FOREIGN PATENT DOCUMENTS

| CN | 1495990 A | 5/2004 |
| DE | 10158790 A1 | 12/2002 |
| DE | 10328781 A1 | 3/2004 |
| DE | 102006014297 A1 | 10/2007 |
| DE | 102008032317 A1 | 12/2009 |
| DE | 102005050036 A1 | 5/2012 |
| JP | 2006288181 A | 10/2006 |
| JP | 2009253699 A | 10/2009 |

OTHER PUBLICATIONS

For DE 10 2006 014 297 A1 an English abstract is provided.
For DE 10 2008 032 317 A1 an English abstract is provided.

* cited by examiner

*Primary Examiner* — Yemane Mehari

(57) ABSTRACT

In various embodiments, a driving circuit for a transistor is provided, wherein the transistor may include a transistor having a control terminal, a diode, a capacitance with a first terminal and a second terminal, wherein the first terminal may be coupled to the control terminal and the second terminal may be coupled to a reference potential via the diode, and a resistor, which is coupled in parallel to the capacitance.

13 Claims, 3 Drawing Sheets

US 9,344,006 B2

DRIVING CIRCUIT FOR A TRANSISTOR

TECHNICAL FIELD

Various embodiments relate to driving circuit for a transistor.

BACKGROUND

In applications where a transistor, such as a power transistor, for example an IGBT (insulated gate bipolar transistor), is used to switch higher powers, pulse currents may be generated during the switching on of the transistor. Those pulse currents may be originating from other circuit components provided upstream of the power transistor which may discharge, e.g. an intermediate voltage circuit or a voltage link circuit arranged between the power supply and the power transistor. Pulse currents may have magnitudes lying outside the specification range of the power transistor and may thereby damage or even destroy the power transistor.

In order to prevent pulse currents from occurring, the power transistor may be switched via a high gate resistance such that the switching process is slowed down. However, the beneficial effect of this measure with regard to reducing the pulse currents is very small and can be neglected. A further possible countermeasure may be seen in providing a capacitance which is coupled in parallel between the gate and emitter/source of the power transistor. Unfortunately, this measure may drastically increase switch-off losses since the power transistor is switched off slowly and therefore a tail current may present, contributing to total switching losses.

SUMMARY

In various embodiments, a driving circuit for a transistor is provided, wherein the transistor may include a transistor having a control terminal, a diode, a capacitance with a first terminal and a second terminal, wherein the first terminal may be coupled to the control terminal and the second terminal may be coupled to a reference potential via the diode, and a resistor, which is coupled in parallel to the capacitance.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The pulse currents which may occur during the switching on (i.e. during a phase in which the device is rendered into a conducting state) of a power transistor originating from discharge of other circuit components provided upstream of the power transistor, e.g. an intermediate voltage circuit or a voltage link circuit arranged between the power supply and the power transistor, may be reduced by providing a functional circuit according to various embodiments between the control terminal (e.g. the gate) and the emitter or source region of the power transistor. The functional circuit according to various embodiments may enable a slow charging of the gate of the power transistor which may take place independently of the input capacitance of the gate, however, without affecting the switching off (i.e. the process of rendering the device into a non-conducting state) of the power transistor. In other words, the functional circuit coupled between the gate and the emitter/source region of the power transistor may be configured to only alter the switching on of the power transistor without affecting its switching off. Thereby, the pulse current and gate oscillations, e.g. oscillations of the voltage provided at the gate of the power transistor during switching on thereof, may be considerably reduced. In the following, the functional circuit according to various embodiments together with the power transistor which it may be connected will be referred to as a driving circuit for a transistor according to various embodiments.

Figure 1:
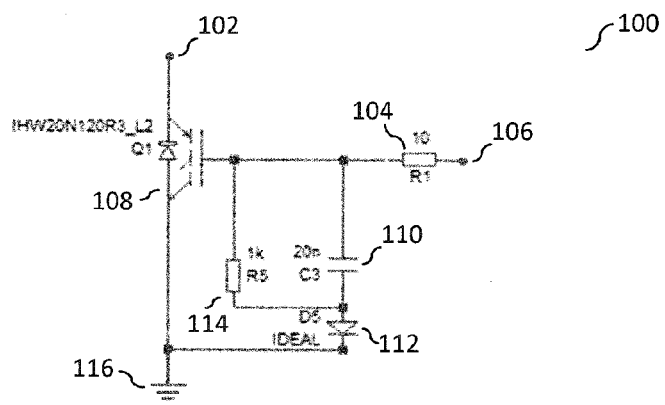
FIG. 1 shows the driving circuit for a transistor according to various embodiments.

In FIG. 1, a driving circuit for a transistor 100 according to various embodiments is shown. The driving circuit 100 may include a first input 102 which may be coupled to a first conduction terminal of a switch, e.g. a first collector/emitter terminal of a transistor 108. The transistor 108 includes a second terminal, e.g. a second collector/emitter terminal, which may be connected to a reference potential 116, e.g. the ground potential. The transistor 108 includes a control terminal, e.g. a gate terminal, which may correspond to or be coupled to a control region, e.g. a gate region, of the transistor 108. A second input 106 of the driving circuit 100 according to various embodiments may be coupled to the control terminal of the transistor 108 via a first resistor 104, e.g. a gate resistor. One side of a capacitance 110 may be coupled to the electrical path between the first resistor 104 and the control terminal of the transistor 108, the other side of the capacitance 110 may be coupled to the reference potential 116 via a diode 112, wherein the anode of the diode 112 is coupled to the capacitance 110. A second resistor 114 is coupled in parallel to the capacitance 110, i.e. a first terminal of the second resistor 114 may be coupled to the electrical path between the control terminal of the transistor 108 and the first resistor 104 and a second terminal of the second resistor 114 may be coupled to the electrical path between the capacitance 110 and the diode 112.

The capacitance 110 may have a capacitance value which is substantially larger than the sum of stray or/and parasitic capacitances in the system, e.g. within the driving circuit for a transistor 100 according to various embodiments, which may typically lie on the order of a few nanofarad. For example the capacitance value of the capacitance may be larger than the sum of stray or/and parasitic capacitances within the driving circuit for a transistor 100 according to various embodiments at least by a factor of 5, for example by a factor of 10, for example by a factor of 15 or more. The electronic components described above which are included in the driving circuit for a transistor 100 according to various embodiments may be monolithically integrated within one substrate with the transistor 108. However, at least one of the components may be also provided as a separate component, for example in the form of an SMD (surface-mount device) and for example be appropriately coupled to a PCB (printed circuit board) which may include the driving circuit for a transistor 100 according to various embodiments. The transistor 108 may be any kind of power transistor, i.e. a transistor which is configured to carry high currents, e.g. currents which are in the range of a few tens of amperes, and which can withstand high operating voltages, i.e. have a high blocking voltage, e.g. exceeding one kilovolt. The transistor 108 may for example be an IGBT.

In order to determine whether the transistor 108 is to be switched on or switched off, the driving circuit for a transistor 100 according to various embodiments may be configured to receive a corresponding signal at its second input 106 which may dictate the state of the transistor 108. For example, the transistor 108 may be switched on by providing charges to its control region, e.g. the gate region, or, in other words, by providing a positive voltage (and/or current) at the second input 106. The transistor 108 may be switched off by discharging the control region of the transistor or, in other words, by providing a low potential or a zero potential at the second input 106, for example by connecting the second input 106 to the reference potential.

A current (or a voltage) may be applied to the first input of the driving circuit for a transistor 100 according to various embodiments. The functional circuit which may be formed by all the electronic components shown in FIG. 1 expect for the transistor 108 may provide a soft switching on of the transistor 108 and a hard switching off of the transistor 108. During switching on of the transistor, the parallel arrangement of the second resistor 114 and the capacitance 110 acts as an RC network and delays the rise of the voltage at the control terminal of the transistor 108. In other words, the driving circuit for a transistor 100 according to various embodiments may be configured to provide a slowed or decelerated switching on of the transistor 108. The term slowed or decelerated may be understood to relate to a switching on of the transistor 108 which takes place slower or in a decelerated manner when compared to a switching on of an analogous transistor without using the functional circuit, so for example just by applying a voltage (or a current) to the control terminal of the corresponding transistor via a gate resistor. The slowed switching on process may reduce the pulse current which may be caused by a discharge of a circuit connected to the first input 102 of the driving circuit for a transistor 100 according to various embodiments. Simultaneously, the slowed switching on of the transistor 108 may also reduce oscillations of the control terminal voltage, e.g. the gate voltage.

When the transistor 108 is to be switched off and therefore, for example, the second input 106 is coupled to the reference potential 116 (for example by a circuit which may be coupled to the second input 106 of the driving circuit for a transistor 100 according to various embodiments and may be configured to provide a switching signal to the control terminal of the transistor 108), the diode 112 is reverse biased and prevents the capacitance 110 from discharging, such that the control region of the transistor 108 may be discharged fast or, in other words, the voltage drop at the control terminal of the transistor 108 may drop fast and hence the transistor 108 may be switched off fast. Put differently, the driving circuit for a transistor 100 according to various embodiments may be configured to provide hard switching off of the transistor 108, i.e. without a delay or a decelerating effect compared to a corresponding transistor 108 being switched off without using the functional circuit, so for example just by discharging the control region of the corresponding transistor via a gate resistor. By providing the diode which is coupled in series between the second collector/emitter terminal of the transistor 108 and the parallel arrangement including the second resistor 114 and the capacitance 110, the capacitance 110 may be rendered non-effective during the switching off of the transistor 108 and thereby it may not influence the (mostly desired) fast switching off of the transistor 108.

One possible of very many application examples for the driving circuit for a transistor 100 according to various embodiments may be a voltage converter with a parallel resonant circuit. The parallel resonant circuit may be driven at frequencies which are higher than its (inherent) resonance frequency (such a mode of operation is also referred to as over resonant), i.e. the operating point of the corresponding voltage converter does not coincide with the resonance frequency. This non-resonant operating point may be used at low output frequencies, for example.

Figure 2:
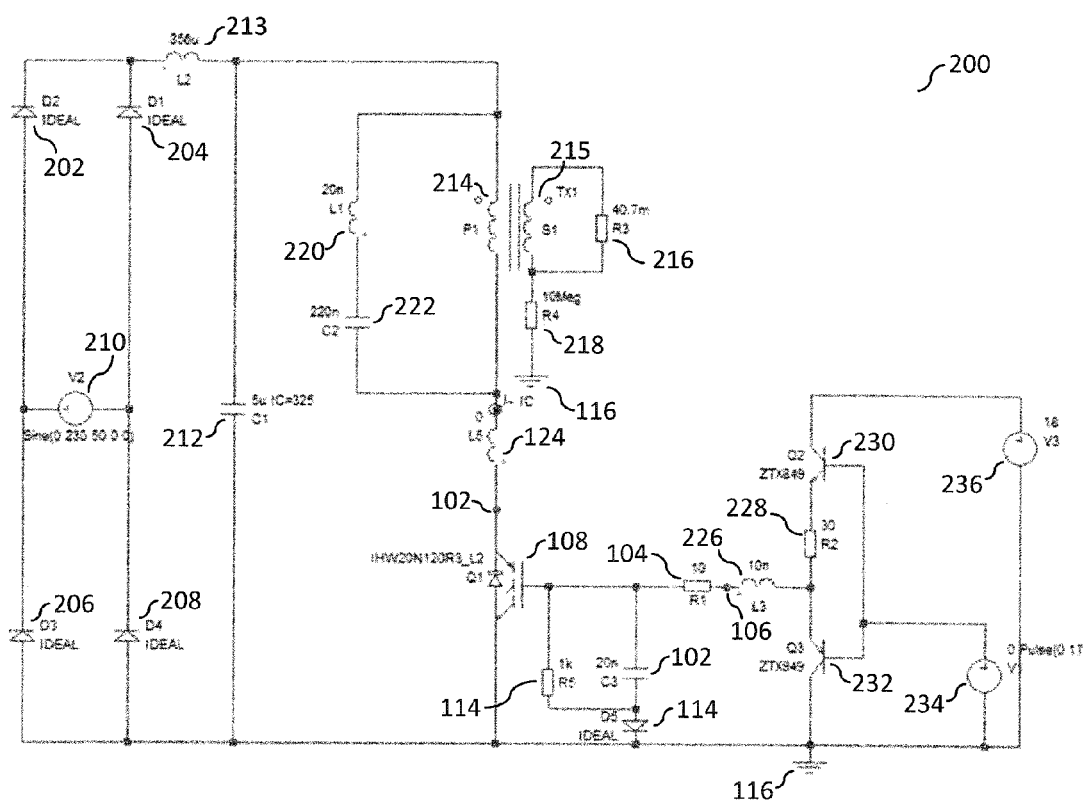
FIG. 2 shows a voltage converter in which the driving circuit for a transistor according to various embodiments is used.

In FIG. 2 an exemplary embodiment of such a voltage converter 200 with a parallel resonant circuit is shown. The converter topology illustrated in FIG. 2 may be also referred to as quasi resonant forward converter. The driving circuit for a transistor 100 according to various embodiments is included in the voltage converter 200 shown in FIG. 2 such that its components carry the reference numbers already introduced in FIG. 1 and they themselves or their functionality will not be described again as the same as already described with respect to FIG. 2. The voltage converter 200 as shown in FIG. 2 may be used in an inductive cooking set, lamp ballast circuits and motor control circuits to name a few non-limiting examples.

The voltage converter 200 may include a constant voltage source which in this exemplarily embodiment is realized via an AC voltage generator 210, its voltage being rectified via four diodes (the first diode 202, the second diode 204, the third diode 206 and the fourth diode 208). The rectified voltage may be then applied across a first capacitance 212, which for example may be a DC link capacitance, wherein a first inductance 213 may be coupled between the second diode 204 and one side of the first capacitance 212. The other side of the first capacitance 212 may be coupled to the reference potential 116, for example the ground potential. A node located in the electrical path between the first inductance 213 and the first capacitance 212 may be coupled to one side of a second inductance 214 and to a first side of a series arrangement including a fourth inductance 220 and a second capacitance 222. The series arrangement of the fourth inductance 220 and the second capacitance 222 may form a resonance circuit coupled in parallel to the second inductance 214. The second inductance 214 is inductively coupled to a third inductance 215. The second inductance 212 and the third inductance 215 may therefore, for example, be arranged on a common magnetic core, for example a copper core, and form a transformer. The third inductance 215 is coupled to the reference potential 116 via a third resistor 218 and a fourth resistor 216 may be coupled in parallel to the third inductance 215. A second side of the series arrangement including the fourth inductance 220 and the second capacitance 222 is coupled to the other side of the second inductance 214 and via a fifth inductance 124 to the first input 102 of the driving circuit for a transistor 100 according to various embodiments as shown in FIG. 1.

The voltage converter 200 may further include a control circuit generating switching signals for the transistor 108. The control circuit may include a voltage source 236 which may be coupled to the second input 106 of the driving circuit for a transistor 100 according to various embodiments via a series arrangement including a first switch 230, for example a first transistor, a fifth resistor 228 and a sixth inductance 226. A second switch 232, for example a second transistor, may be coupled between the reference potential 116 and the electrical path between the first switch 230 and the sixth inductance 226. Both the first switch 230 and the second switch 232 may be controlled by a pulse generator 234 which therefore may be coupled to the control terminal, e.g. a gate, of the first switch 230 and the control terminal of the second switch 232.

The voltage converter 200 may be configured to provide power to a load which in this exemplary embodiment is represented by the third inductance 218 and is coupled to the third inductance 215, i.e. to a secondary side of the transformer.

The transistor 108 may be switched on and switched off for predetermined periods of time in order to determine the amount of energy which is to be transferred from the second inductance 214 of the transformer to the third inductance 215 of the transformer. When the transistor 108 is conducting, a current flow from the voltage generator through the second inductance 214 and the transistor 108 is permitted. During that time, the current flow steadily increases and energy is stored in the second capacitance 222 in the resonance circuit. By adjusting the on time of the transistor 108, the amount of energy stored in the second capacitor 222 may be determined. When the transistor 108 is switched off, the current flow is interrupted and hence the voltage across the transistor 108 increases, its magnitude and time scale being dictated by the oscillation process being initiated by the oscillation circuit, i.e. the fourth inductance 220 and the second capacitance 222. This voltage across the second inductance 214 induces a current flow through the third inductance 215 which may be provided to the load. When the transistor 108 is operated at a higher (switching) frequency than the resonance frequency of the resonance circuit and upon the occurrence of the first peak of the pulse current, when an application including the voltage converter 200 according to various embodiments is switched on for the first time, the second capacitance 222 may be discharged through the transistor 108.

During switching on of the transistor 108, a pulse current may originate in the circuit part arranged between the power source and the transistor 108 and/or by stray inductances which react on the sudden voltage drop caused by the switching on of the transistor 108. This will now be discussed with reference to the diagrams shown in FIGS. 3A to 3C.

Figure 3A:
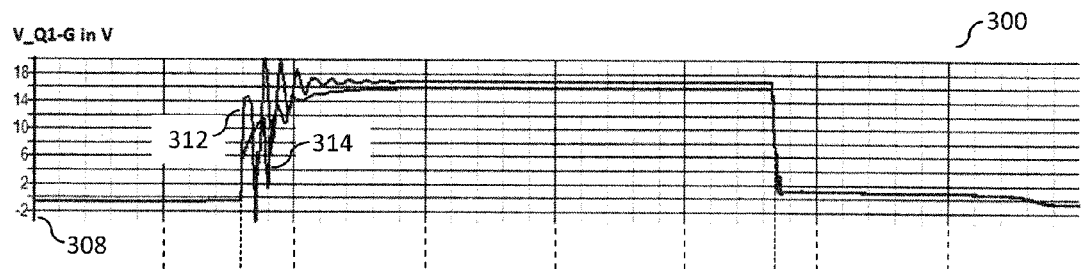
FIGS. 3A to 3C show the developing of operational parameters of the voltage converter according to various embodiments shown in FIG. 2 based on a simulation.
Figure 3B:
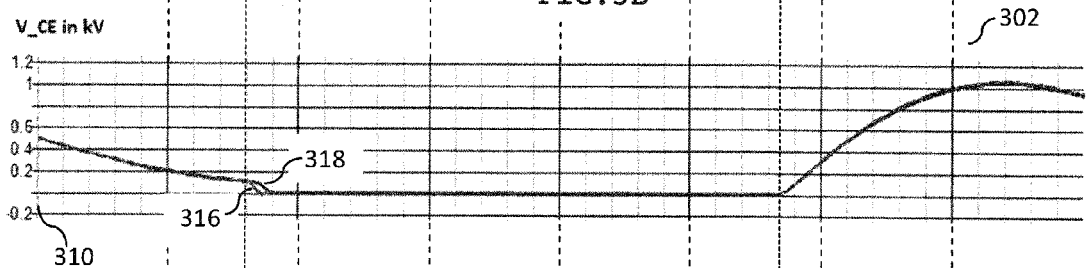
Figure 3C:
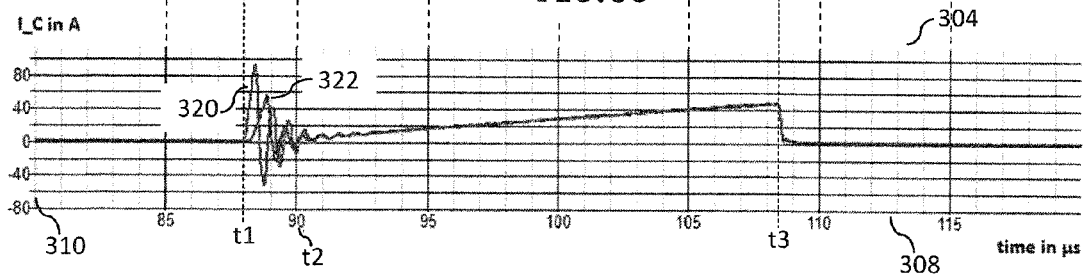

In FIGS. 3A to 3C simulation results based on the voltage converter circuit 200 shown in FIG. 2 are illustrated. In diagram 300 in FIG. 3A a first control terminal voltage 312, e.g. the first gate voltage, and a second control terminal voltage 314, e.g. the second gate voltage, at the control terminal, e.g. the gate, of the transistor 108 are shown. In the following, those parameters will be referred to as a first gate voltage 312 and a second gate voltage 314, respectively. In diagram 302 in FIG. 3B a first voltage 316 between the two collector/emitter terminals of the transistor 108 and a second voltage 318 between the two collector/emitter terminals of the transistor 108 are shown. In the following, those parameters will be referred to as a first transistor voltage 316 and a second transistor voltage 318, respectively. In diagram 304 in FIG. 3C a first current 320 between the two collector/emitter terminals of the transistor 108 and a second current 322 between the two collector/emitter terminals of the transistor 108 are shown. In the following, those parameters will be referred to as a first transistor current 320 and a second transistor current 322, respectively. The y-axis 308 in the first diagram 300 in FIG. 3A and the second y-axis in the second diagram 302 in FIG. 3B both denote a voltage in volts and kilovolts, respectively. The third y-axis 310 in diagram 304 in FIG. 3C denotes a current in ampere. All three diagrams share a common x-axis 308 which denotes time in microseconds, such that all the curves shown in the three diagrams are synchronised. The time offset on the x-axis 308 is arbitrary and not relevant for the explanation given below.

The graphs (or curves) representing the first gate voltage 312, the first voltage transistor voltage 316 and first transistor current 320 are based on a corresponding voltage converter circuit which differs from the voltage circuit 200 according to various embodiments in that the transistor 108 is driven in a conventional way, e.g. solely by the first resistor 104, i.e. without the capacitance 110, the second resistor 114 and the diode 112. The converter topology without the functional circuit according to various embodiments will be referred to as the first case in the following. The graphs (or curves) referred to as the second gate voltage 314, the second transistor voltage 318 and the second current 322 are based the voltage circuit 200 according to various embodiments as shown in FIG. 2, e.g. with the functional circuit according to various as shown in FIG. 1 embodiments being included therein. The converter topology including the functional circuit (in other words the driving circuit for a transistor 100 according to various embodiments) will be referred to as the second case in the following.

Before a time t1 the transistor 108 is in a non-conducting state. Both gate voltages 312,314 are approximately zero and the transistor currents 320,322 which also represent the currents through the fourth inductance 214 in the respective case are equal to zero. The transistor voltages 316,318 are declining towards values well below 100 volts.

At time t1, the transistor 108 is switched on, for example by a corresponding signal provided to its control terminal by the control circuit of the voltage converter 200 according to various embodiments. Shortly after time t1 it can be observed that the transistor voltage 316,318 across the transistor drops to approximately zero in the first case and in the second case. Upon switching on of the transistor 108, a pulse current through the transistor 108 may be observed, manifesting itself in an oscillation of the transistor current 320,322 in the first case and the second case. Simultaneously, an oscillation of the control terminal voltage 312,314 may be observed in the first case and in the second case.

However, the graphs based on the first case can be clearly distinguished from the graphs based on the second case. It can be clearly seen that by using the driving circuit for a transistor 100 according to various embodiments, the oscillations of the second gate voltage 314 are far less pronounced than those of the first gate voltage 312. During the time the transistor 108 is being switched on, i.e. between time t1 and roughly time t2, the second gate voltage 314 may be recognized to increase exponentially to approximately 16V with an oscillation overlaying the exponential increase. At no time during the switch on process does the first gate voltage 314 exceed its target value, which in this exemplary scenario is equal to approximately 16V. In contrast thereto, the first gate voltage 312 can be clearly seen to be dominated by heavy oscillations such that an exponential increase thereof may be hardly discerned. In addition, the first gate voltage 312 exceeds its target value of approximately 17V several times during the switching on process of the transistor 108.

A similar observation can be made with respect to the comparison of the first transistor current 320 to the second transistor current 322. While in the first case the first transistor current 320 features heavy oscillations with peak currents well above 80 amperes due to the pulse current, those oscillations of the second transistor current 318 are far less pronounces with peak values below 50 amperes.

After the transistor 108 has been switched on, i.e. approximately after the time t2, up to the point when the transistor 108 is switched off, i.e. at a time t3, and thereafter, there is hardly any difference between the behaviour of the converter circuit without the driving circuit for a transistor 100, i.e. in the first case, and the converter circuit 200 according to various embodiments, i.e. in the second case. This may be seen from the fact that the curves in the first case and the curves in the second case are practically identical (for example from a point in time corresponding to approximately 95 microseconds on the x-axis).

In conclusion, the simulation results clearly demonstrate that the driving circuit for a transistor 100 according to various embodiments may substantially reduce both oscillations of the gate voltage 312,314 of the transistor 108 as well as the pulse current which are both occurring during the switching on of the transistor 108. The driving circuit for a transistor 100 according to various embodiments may be configured to alter the switching on process of the transistor 108 in an advantageous manner such that the pulse current may be considerably reduced and the oscillations of the gate voltage may be considerably reduced without affecting the phase during which the transistor 108 remains in conducting state or without affecting the phase during which the transistor 108 is switched off.

Figure 4A:
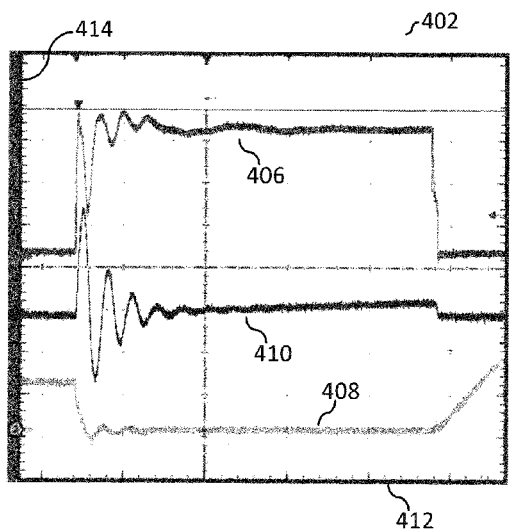
FIGS. 4A and 4B show the developing of operational parameters of the voltage converter according to various embodiments shown in FIG. 2 based on an actual measurement.
Figure 4B:
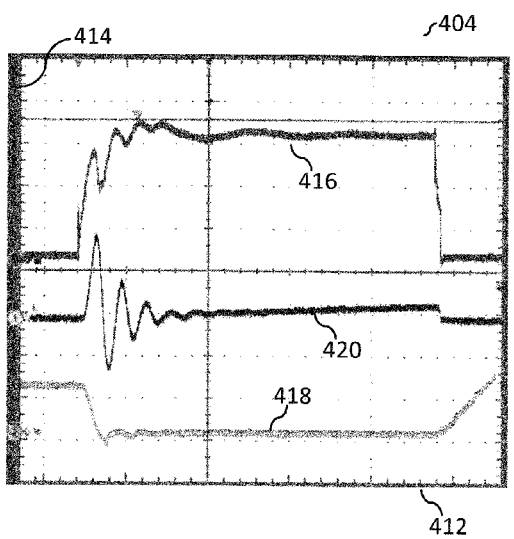

In FIGS. 4A and 4B measuring results corresponding to the simulation results shown in FIGS. 3A to 3C are illustrated in the form of screenshots from an oscilloscope. The curves shown in diagram 402 in FIG. 4A correspond to measurement results relating to an implementation of the voltage converter without the functional circuit included in the driving circuit for a transistor 100 according to various embodiments, i.e. in a voltage converter where, for example, the gate terminal of the transistor 108 may be connected to a control circuit controlling the state of the transistor 108 (i.e. weather it is conducting or non-conducting) via a gate resistor. Other than that, the implementation of the converter used in the first case and yielding the results illustrated in FIG. 4A may be identical to the circuit scheme shown in FIG. 2. The curves shown in diagram 404 in FIG. 4B correspond to measurement results relating to an implementation of the voltage converter 200 according to various embodiments based on the circuit scheme shown in FIG. 2, i.e. with the same components with parameters as indicated in the circuit diagram shown in FIG. 2.

The x-axis 412 in the first diagram 402 and in the second diagram 404 denotes time in microseconds, wherein each division (marked by two adjacent marks on the x-axis 412) corresponds to 5 microseconds. The y-axis 414 in the first diagram 402 and in the second diagram 404 is a combined y-axis for the corresponding signals, each signal having its own division of the y-axis.

In the first diagram 402, the first gate voltage of the transistor is represented by a first curve 406, the first transistor voltage is represented by a second curve 408 and the first transistor current is represented by a third curve 410. All those three curves shown in diagram 402 in FIG. 4A represent measurement results in the first case.

In the first diagram 404, the same parameters are illustrated in the same order as in diagram 402, i.e. the second gate voltage of the transistor is represented by a fourth curve 416, the second transistor voltage is represented by a fifth curve 418 and the second transistor current is represented by a third curve 420. All those three curves shown in diagram 404 in FIG. 4B represent measurement results in the first case.

The observations made with respect to the diagrams shown in FIG. 3A to 3C apply in an analogous manner to the diagrams shown in FIGS. 4A and 4B. It can be seen that in the second case, the driving circuit for a transistor 100 according to various embodiments is able to the oscillations of the second gate voltage 416 during switching on of the transistor by transforming the steep rising edge of the first gate voltage 406 in the first case into a "softer" slope of the second gate voltage 416 in the second case. Also, in the second case it can be seen that the first gate voltage 416 on average features an exponential rise. The magnitude of the oscillation or ripple of the second transistor current 420 in the second case is smaller than the magnitude of the oscillation or ripple of the first transistor current 410 in the first case. In this exemplary comparison of the two converter circuits, the maximum current value reached by the first peak in the oscillating first transistor current 410 in the first case is approximately 76 A as compared to the maximum current value reached by the first peak in the oscillating second transistor current 420 in the second case which is approximately 60 A.

A method for driving a transistor, for example using the driving circuit for a transistor 100 according to various embodiments, may be further provided. In accordance with the method, a transistor may be switched on by providing a suitable potential to its control region, e.g. by applying a suitable gate voltage to its gate terminal, via the functional circuit according to various embodiments. The functional circuit may have the effect that the transistor is switched on more slowly than in the conventional driving scheme in favour of reducing the pulse current and oscillations of the gate voltage. In accordance with the method, the transistor may be switched off by providing a suitable potential to its control region, for example by applying a potential corresponding to the reference potential to its gate terminal, via the functional circuit according to various embodiments. The functional circuit may not affect the process of switching off of the transistor which therefore may be advantageously be switched off in an equivalent manner, e.g. at the same speed, as it would be switched off according to a conventional driving scheme.

According to various embodiments of the driving circuit for a transistor 100, its use may enable the use of power transistors, e.g. IGBTs, with smaller active chip areas. Due to the reduction of the pulse current a smaller active chip area may be needed to satisfy the same rating with respect to the maximum current density which the transistor 108 would have to withstand. The method for reducing the pulse current during switching of a power transistor may be for example used with trenchstop IGBTs and fieldstop IGBTs. In a fieldstop IGBT, an additional fieldstop layer is implemented between the substrate region and the collector layer. The fieldstop layer is designed to decrease the remaining transistor electric field (i.e. the remaining electric field between the two emitter/collector terminals) within this layer to zero. In a trenchstop IGBT, a trenched gate is implemented which, instead of a horizontal gate, includes a vertical gate. This means, that the channel may be designed in an optimised way which achieves a lower saturation voltage while having a sufficient breakdown voltage simultaneously. However, the driving circuit according to various embodiments may be used with other kinds of transistors.

In accordance with various embodiments a driving circuit for a transistor is provided, wherein the driving circuit may include a transistor including a control terminal; a diode; a capacitance with a first terminal and a second terminal, wherein the first terminal may be coupled to the control terminal and the second terminal may be coupled to a reference potential via the diode; and a resistor, which may be coupled in parallel to the capacitance.

In various further embodiments of the driving circuit for a transistor the transistor may be configured as a power transistor.

In various further embodiments of the driving circuit for a transistor the transistor may be configured as an IGBT.

In various further embodiments of the driving circuit for a transistor the control terminal of the transistor may include a gate of the transistor.

In various further embodiments of the driving circuit for a transistor the capacitance value of the capacitance may be larger than a sum of parasitic capacitances of the driving circuit at least by a factor of 5.

In various further embodiments, the driving circuit for a transistor may further include a switch circuit configured to generate a switching signal, wherein an output of the switch circuit may be coupled to the control terminal of the transistor.

In various further embodiments of the driving circuit for a transistor a control terminal resistor may be coupled between the control terminal and the output of the switch circuit.

In various further embodiments of the driving circuit for a transistor the driving circuit may be configured to delay a potential increase at the control terminal induced by a switching on signal provided to the control terminal when the transistor is to be switched on.

In accordance with various embodiments, a control circuit for a transistor is provided, wherein the control circuit may include a transistor including a gate terminal; a diode; a capacitor with a first side and a second side, wherein the first side may be coupled to the gate terminal and the second side may be coupled to a reference potential via the diode; and a resistor with a first terminal and a second terminal, wherein the first terminal may be coupled to the gate terminal and the second terminal may be coupled to the electrical path between the capacitor and the diode.

In various further embodiments of the control circuit for a transistor the transistor may be configured as a power transistor.

In various further embodiments of the control circuit for a transistor the transistor may be configured as an IGBT.

In various further embodiments of the control circuit for a transistor the capacitance of the capacitance may be larger than a sum of parasitic capacitances of the driving circuit at least by a factor of 5.

In various further embodiments of the control circuit for a transistor the transistor may further include a gate which may be coupled to the gate terminal.

In various further embodiments, the driving circuit for a transistor may further include a switch circuit configured to switch on and switch off the transistor, wherein an output of the switch circuit may be coupled to the gate terminal of the transistor.

In various further embodiments of the driving circuit for a transistor a gate resistor may be coupled between the control terminal and the output of the switch circuit.

In various further embodiments of the driving circuit for a transistor the driving circuit may be configured to delay a potential increase at the gate terminal induced by a switching on signal provided to the gate terminal when the transistor is to be switched on.

In accordance with various further embodiments, a power converter may be provided, the power converter comprising: a power source; a transformer including a primary side and a secondary side, wherein the power source may be coupled to one side of the primary side of the transformer; a driving circuit for the transistor, comprising: a transistor including a control terminal; a diode; a capacitance with a first terminal and a second terminal, wherein the first terminal may be coupled to the control terminal and the second terminal may be coupled to a reference potential via the diode; and a resistor, which may be coupled in parallel to the capacitance, wherein the transistor may be coupled between a second side of the primary side of the transformer and the reference potential.

In various further embodiments the power converter may include a series arrangement including a second capacitance and a second inductance, wherein one side of the series arrangement may be coupled to the first side of the primary side of the transformer and the other side of the series arrangement may be coupled to the second side of the primary side of the transformer.

In various further embodiments the power converter may be configured as a non-resonant forward converter.

In various further embodiments of the power converter the secondary side of the transformer may be configured to provide a power to a load.

In various further embodiments of the power converter the transistor may be configured as a power transistor.

In various further embodiments of the power converter the transistor may be configured as an IGBT.

In various further embodiments of the power converter the control terminal of the transistor may include a gate of the transistor.

In various further embodiments of the power converter the capacitance value of the capacitance may be larger than a sum of parasitic capacitances of the driving circuit at least by a factor of 5.

In various further embodiments the power converter may further include a switch circuit configured to generate a switching signal, wherein an output of the switch circuit may be coupled to the control terminal of the transistor.

In various further embodiments of the power converter a control terminal resistor may be coupled between the control terminal and the output of the switch circuit.

In various further embodiments of the power converter the driving circuit may be configured to delay a potential increase at the control terminal induced by a switching on signal provided to the control terminal when the transistor is to be switched on.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A driving circuit for a transistor, comprising: a transistor comprising a control terminal and an emitter terminal; a diode; a capacitor with a first terminal and a second terminal, wherein the first terminal is coupled to the control terminal and the second terminal is coupled to a reference potential via the diode; and a resistor, which is coupled in parallel to the capacitor; wherein the driving circuit is coupled between the control terminal and the emitter terminal; wherein the capacitance value of the capacitor is larger than a sum of parasitic capacitances of the driving circuit at least by a factor of 5.

2. The driving circuit for a transistor of claim 1,
wherein the transistor is configured as a power transistor.

3. The driving circuit for a transistor of claim 1,
wherein the transistor is configured as an IGBT.

4. The driving circuit for a transistor of claim 1,
wherein the control terminal of the transistor comprises a gate of the transistor.

5. The driving circuit for a transistor of claim 1, further comprising:
a switch circuit configured to generate a switching signal, wherein an output of the switch circuit is coupled to the control terminal of the transistor.

6. The driving circuit for a transistor of claim 1,
wherein the driving circuit is configured to delay a potential increase at the control terminal induced by a switching on signal provided to the control terminal when the transistor is to be switched on.

7. A control circuit for a transistor, comprising: a transistor comprising a gate terminal and an emitter terminal; a diode; a capacitor with a first side and a second side, wherein the first side is coupled to the gate terminal and the second side is coupled to a reference potential via the diode; and a resistor with a first terminal and a second terminal, wherein the first terminal is coupled to the gate terminal and the second terminal is coupled to the electrical path between the capacitor and the diode; wherein the control circuit is coupled between the gate terminal and the emitter terminal; wherein the capacitance value of the capacitor is larger than a sum of parasitic capacitances of the driving circuit at least by a factor of 5.

8. The control circuit for a transistor of claim 7,
wherein the transistor is configured as a power transistor.

9. The control circuit for a transistor of claim 7,
wherein the transistor is configured as an IGBT.

10. The control circuit for a transistor of claim 7,
wherein the transistor further comprises a gate which is coupled to the gate terminal.

11. The control circuit for a transistor of claim 7, further comprising:
a switch circuit configured to switch on and switch off the transistor, wherein an output of the switch circuit is coupled to the gate terminal of the transistor.

12. The control circuit for a transistor of claim 11,
wherein a gate resistor is coupled between the control terminal and the output of the switch circuit.

13. The control circuit for a transistor of claim 7,
wherein the driving circuit is configured to delay a potential increase at the gate terminal induced by a switching on signal provided to the gate terminal when the transistor is to be switched on.

\* \* \* \* \*